(12) United States Patent
Tanaka et al.

(10) Patent No.: US 8,214,720 B2
(45) Date of Patent: Jul. 3, 2012

(54) BIT ERROR PREVENTION METHOD AND INFORMATION PROCESSING APPARATUS

(75) Inventors: Shinji Tanaka, Osaka (JP); Tetsuo Furuichi, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 984 days.

(21) Appl. No.: 11/968,964

(22) Filed: Jan. 3, 2008

(65) Prior Publication Data

US 2008/0189588 A1 Aug. 7, 2008

(30) Foreign Application Priority Data

Feb. 7, 2007 (JP) ................................. 2007-028168

(51) Int. Cl.
*G11C 29/44* (2006.01)
*G11C 29/54* (2006.01)
(52) U.S. Cl. ...................................... 714/764; 714/754
(58) Field of Classification Search .......................... None
See application file for complete search history.

(56) References Cited

U.S. PATENT DOCUMENTS

| 5,974,576 A * | 10/1999 | Zhu ................. 714/704 |
| 6,144,079 A * | 11/2000 | Shirahata et al. ............ 257/392 |
| 2004/0257888 A1* | 12/2004 | Noguchi et al. .............. 365/200 |
| 2005/0169062 A1* | 8/2005 | Kondo et al. ............ 365/189.05 |
| 2005/0210184 A1 | 9/2005 | Chen et al. |
| 2007/0263440 A1* | 11/2007 | Cornwell et al. ......... 365/185.03 |

FOREIGN PATENT DOCUMENTS

| JP | 8-138395 | 5/1996 |
| JP | 8-279295 | 10/1996 |
| JP | 11-16380 | 1/1999 |
| JP | 2004-240793 | 8/2004 |
| JP | 2004-310650 | 11/2004 |
| JP | 2005-122800 | 5/2005 |
| JP | 2005-141827 | 6/2005 |
| JP | 2005-196871 | 7/2005 |
| JP | 2007-18708 | 1/2007 |
| WO | WO 01/22232 A1 | 3/2001 |

* cited by examiner

*Primary Examiner* — Ajay Bhatia
*Assistant Examiner* — Dipakkumar Gandhi
(74) *Attorney, Agent, or Firm* — Oblon, Spivak, McClelland, Maier & Neustadt, L.L.P.

(57) ABSTRACT

Whether the comparison value of temporarily stored data which is read out from a flash memory by a host system exceeds a threshold value related to a bit error or not is checked, and if the comparison value exceeds the threshold value, the temporarily stored data which is read out is rewritten into the flash memory. If the temporarily stored data has an error, the error is corrected by an error correction part and then the data is rewritten. The threshold value includes, e.g., the number of readouts, the number of bit errors and the number of accumulated occurrences of bit errors. The present invention is suitable for prevention of bit errors due to read disturb and can recover the bit data which changes with time, and therefore makes it possible to improve the reliability of the flash memory by preventing occurrence of bit errors.

21 Claims, 5 Drawing Sheets

BIT ERROR PREVENTION METHOD AND INFORMATION PROCESSING APPARATUS

BACKGROUND OF THE INVENTION

1. Field of the Invention

The present invention relates to a method of preventing a bit error which occurs in nonvolatile semiconductor memories due to a read disturb or the like, and relates to an information processing apparatus for achieving the prevention method.

2. Description of the Background Art

NAND flash memories, among nonvolatile memories, are heavily used for SD memory cards or the like for the purpose of achieving high integration, reduction in manufacturing cost and easy writing for users by simplifying circuit configurations.

In recent, NAND flash memories are adopted for game machines or the like. When the NAND flash memories are used for game machines, there occurs no write operation but only consecutive read operations. In other words, NAND flash memories have been increasingly adopted as ROMs.

Since specific programs are repeatedly read out in the game machines or the like in most cases, however, it begins to be noticed that the programs could be unintendedly rewritten. Such a phenomenon is termed "read disturb phenomenon", and the mechanism of this phenomenon will be briefly discussed below.

Figure 6:
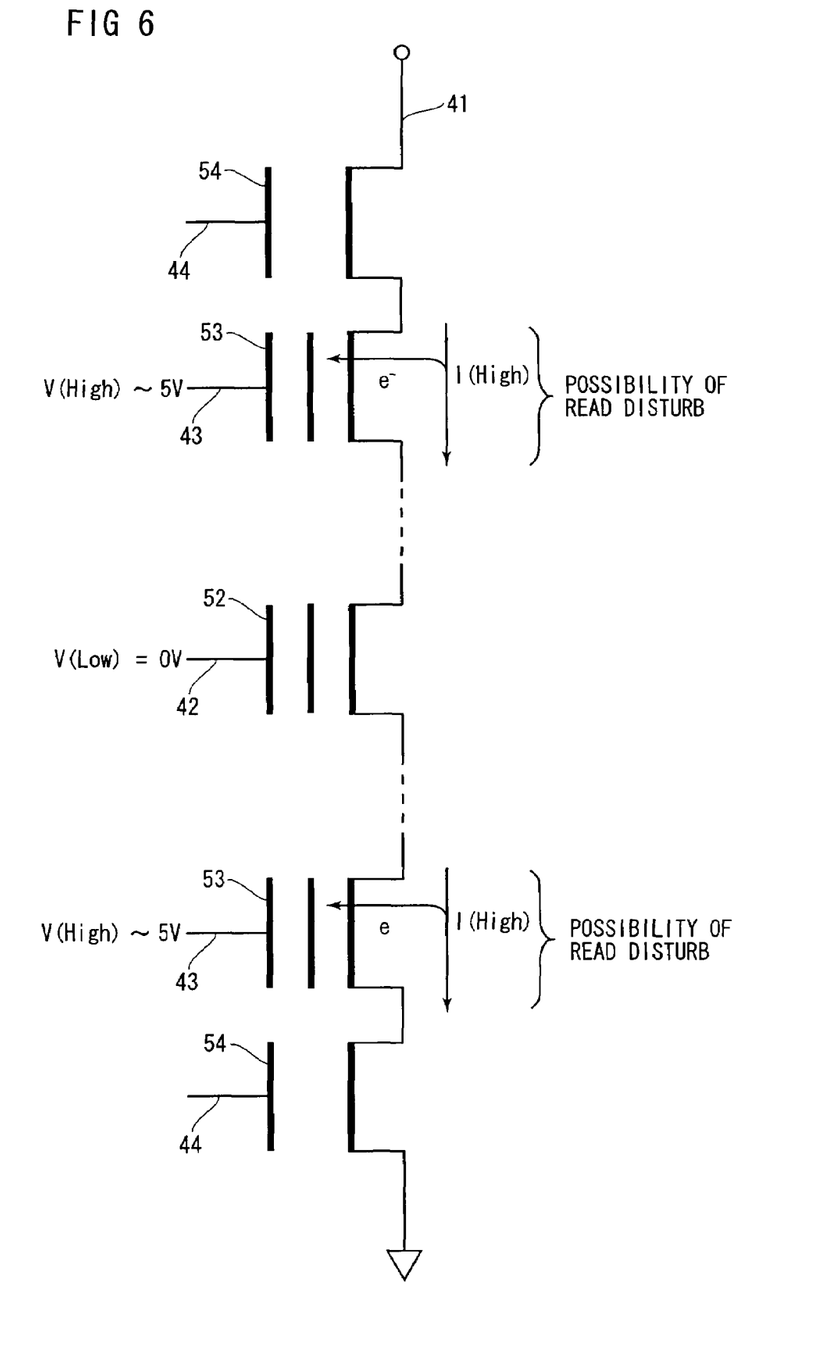
FIG. 6 is a view for discussion on a read disturb.

FIG. 6 is a schematic diagram showing an NAND flash memory. The NAND flash memory is constituted of a bit line 41 and word lines 42, 43 and 44 which are arranged in a lattice manner, memory cells 52 and 53, a selection transistor 54 and the like.

In a case where binary data ("0" or "1") stored in the memory cell 52 is read out, the memory cell 52 is a selected cell and the memory cell 53 is an unselected cell. First, the selection transistor 54 specifies the bit line 41 to which the selected cell 52 belongs. Next, a low gate voltage (V(Low) =0V) is applied to the word line 42 to which the selected cell 52 belongs. Then, a high gate voltage (V(High) of approximately 5V) is applied to the word line 43 to which the unselected cell 53 belongs. At that time, since the unselected cell 53 is in a very weak writing condition, electrons are trapped in a floating gate of the unselected cell 53 and accumulated therein. In other words, when binary data stored in the selected cell 52 is repeatedly read out, there is a possibility that a threshold voltage of the unselected cell 53 might be shifted and binary data stored in the unselected cell 53 might be unintendedly rewritten, being changed from "1" to "0".

Even if the binary data stored in the unselected cell 53 is unintendedly rewritten, however, when data are collectively erased before new data are written, it is possible to recover the function of the unselected cell 53. But, if there occurs no write operation and only consecutive read operations, it is impossible to recover the function of the unselected cell 53.

Specifically, herein, a bit error refers to a reversible error caused by a change of the binary data stored in the cell with time, not an irreversible error due to a physical damage. Above all, the bit error due to the read disturb (i.e., read disturb error) is caused by repeated read operations in a specified memory area of a flash memory with no write or erase operation.

US Patent Application Publication No. 2005/0210184 discloses means for avoiding the above-discussed read disturb phenomenon.

In flash memories, generally, the reliability of data is assured by containing an error correction function. As the error correction function, for example, ECC (Error Check and Correct) is used. In the case of using the function of ECC, by installing an ECC (Error-Correcting Code) in a flash memory in advance, even when an error (including a bit error) occurs in the flash memory, if it is an error of several bits, the error is checked when data is read out and the error can be corrected. In one case, for example, where 8-bit error correcting code is set for 64-bit data, when an error occurs, if it is an error of 1 bit, the error can be corrected and outputted.

In NAND flash memories, for example, there is a possibility, however, that an error due to the read disturb may occur in all the unselected cells on the same bit line as the selected cell exists. For this reason, if a specified cell is repeatedly selected, a bit error over the installed error correction capability may eventually occur. Further, this type of error correction function usually corrects only the error of data to be outputted but can not repair the nonvolatile semiconductor memories.

SUMMARY OF THE INVENTION

The present invention is intended for a bit error prevention method of preventing a bit error which is caused by a change of bit data stored in a rewritable nonvolatile semiconductor memory.

According to an aspect of the present invention, the bit error prevention method comprises a condition judgment step of judging whether a repair condition related to the bit error is satisfied or not when stored data which is stored in the nonvolatile semiconductor memory is read out by a host system, and a recovery step of rewriting the stored data which is read out in the nonvolatile semiconductor memory if the stored data which is read out satisfies the repair condition.

By the method of the present invention, it is possible to recover the bit data which changes with time through a rewriting process.

According to another aspect of the present invention, the repair condition is conditioned with a threshold value which is set in advance, the condition judgment step includes the step of judging whether a comparison value of the stored data to be read out, corresponding to the threshold value, exceeds the threshold value or not, and the recovery step includes the step of rewriting the stored data which is read out into the nonvolatile semiconductor memory if the comparison value exceeds the threshold value.

By reducing the number of rewriting operations to a minimum, it is possible to alleviate the deterioration in memory cells due to erase and write operations and achieve a highly reliable system.

According to still another aspect of the present invention, the bit error prevention method further comprises an error correction step of judging whether or not the temporarily stored data has an error when the temporarily stored data is stored into the temporary memory part and correcting the error in the temporarily stored data if the temporarily stored data has an error, and in the bit error prevention method of the present invention, the temporarily stored data with its error corrected is rewritten into the nonvolatile semiconductor memory.

By correcting the error in the stored data in which the bit error occurs with the error correction function such as ECC combined and rewriting the stored data, it is possible to prevent occurrence of the bit error over the correction capability.

Therefore, it is an object of the present invention to provide a method of effectively prevent bit errors which occur in nonvolatile semiconductor memories and an information processing apparatus for achieving the bit error prevention method.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
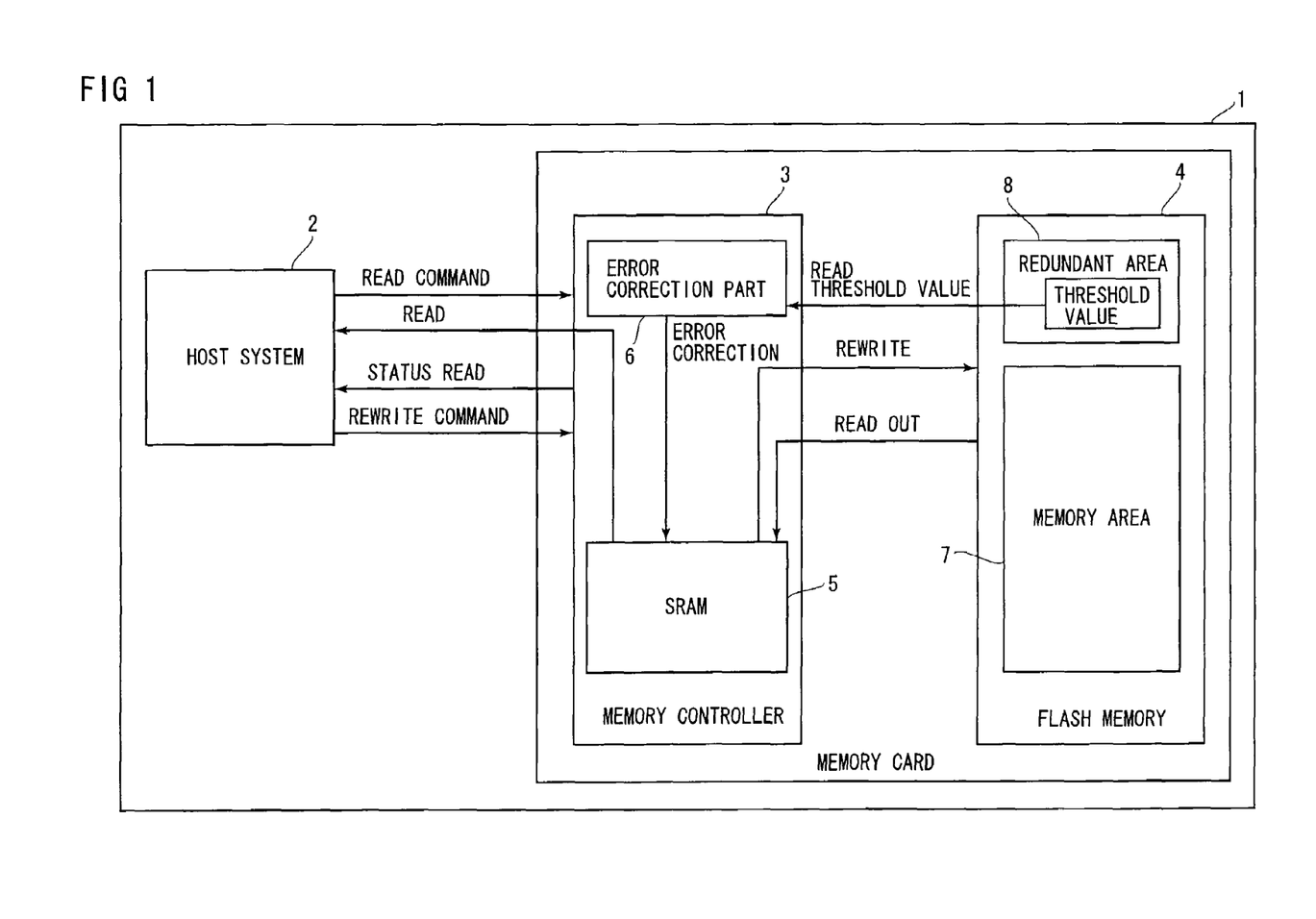
FIG. 1 is a view showing a constitution of an information processing apparatus.

FIG. 1 is a view showing a constitution of an information processing apparatus for achieving a bit error prevention method of the present invention. As shown in FIG. 1, the information processing apparatus 1 is constituted of a host system 2, a memory controller 3, a nonvolatile semiconductor memory (flash memory) 4 and the like. A specific application of the information processing apparatus 1 is, e.g., a game machine.

If the information processing apparatus 1 is a game machine, the memory controller 3 and the flash memory 4 are mounted on a SD card (memory card) or the like and detachable from the game machine as a form of an external memory device such as a game cartridge or the like. Further, the memory controller 3 and the flash memory 4 may be integrated in the information processing apparatus 1, and in short, they have only to be included in any one of constituent elements of the information processing apparatus 1.

<Host System>

The host system 2 is a central processing part for performing a general control on the information processing apparatus 1 and constituted of an operation part, a control part, a memory part, an input/output part and the like. Specifically, the information processing apparatus 1 comprises a CPU, a ROM, a monitor, an operation button and the like, and these constituent elements are controlled by the host system 2. The host system 2 performs, for example, an operation for reading an application program such as a game or the like which is stored in the flash memory 4 and an operation for displaying moving images or the like on the monitor on the basis of the application program which is read out, in response to an instruction from the operation button which a user operates.

<Memory Controller>

The memory controller 3 is a processing part for performing a read operation or the like for data stored into the flash memory 4 in response to a request from the host system 2. Specifically, the memory controller 3 has an interface function for the host system 2 and the flash memory 4 and performs an input/output operation of commands and data from/to the host system 2. The memory controller 3 reads data from the flash memory 4 and writes data into the flash memory 4 in response to the commands from the host system 2 or on the basis of the function of itself.

The memory controller 3 comprises a temporary memory part 5 (SRAM: Static Random Access Memory) for temporarily storing data which is read out from the flash memory 4 and an error correction part 6 for correcting an error in data (temporarily stored data) stored in the temporary memory part 5. Specifically, the memory controller 3 reads stored data from the flash memory 4 and temporarily stores it into the temporary memory part 5 in response to a read request from the host system 2 if receives it. Then, the host system 2 reads the temporarily stored data out.

The error correction part 6 has a function on the basis of a well-known error correction function (ECC) and checks the temporarily stored data which is stored in the temporary memory part 5, and if the temporarily stored data has an error, the error correction part 6 performs an operation of correcting the error. Further, the error correction part 6 of this preferred embodiment reads a threshold value out from the flash memory 4 and checks the temporarily stored data which is stored in the temporary memory part 5 with the threshold value. Then, if a comparison value of the temporarily stored data exceeds the threshold value, the error correction part 6 rewrites the data into the flash memory 4. The rewriting operation discussed herein includes an operation of rewriting the stored data which is read out without any change and an operation of rewriting the stored data which is read out with its error corrected if the stored data has an error. A series of operations of reading the threshold value, checking the stored data and rewriting the stored data may be performed by any constituent element of the information processing apparatus 1, instead of the error correction part 6.

In other words, also in this preferred embodiment, by making full use of the error correction function in accordance with the conventional ECC, the reliability of the flash memory 4 is assured. Since the error correction capability in accordance with ECC is determined by the error correcting code set in advance, however, if the correction capability of 4 bits is determined, for example, correction can not be made any more when there occurs an error over 4 bits. A bit error in the flash memory 4 remains without correction.

For this reason, in the present invention, the conventional ECC function can be complemented by additionally providing a repair condition. With combination of the repair condition and the ECC function, it becomes possible to improve the reliability of memories. The error correction function such as ECC, however, is not always needed. By using a threshold value of the number of readouts as the repair condition, for example, it is possible to prevent occurrence of bit errors.

<Nonvolatile Semiconductor Memory>

The nonvolatile semiconductor memory 4 is a rewritable nonvolatile memory. For example, a flash memory is used as the nonvolatile semiconductor memory. As the flash memory 4, for example, a NOR-type flash memory or a NAND-type flash memory can be used. Though the following discussion will be made on a case where the flash memory 4 is a NAND-type flash memory since the present invention is suitable for the NAND-type flash memory, the flash memory 4 is not limited to this type.

The flash memory 4 stores data (stored data) forming various programs such as application programs of games or the like therein and has a memory area 7 for storing this stored data therein and a redundant area 8 for storing error correction data such as error correcting code or the like therein. The memory area 7 has pages 71 each serving as a unit for writing or reading. Blocks 72 each consists of a plurality of pages 71 and serves as a unit of erasing data (see FIGS. 3A to 3C). In the redundant area 8, a threshold value is set as a repair condition related to a bit error.

Herein, a repair condition related to a bit error refers to a condition set in advance in consideration of the characteristics of the bit error for the purpose of preventing a trouble due to the bit error, and a threshold value refers to a value as reference. The repair condition can be set in consideration of, e.g., the rate of occurrence of bit errors due to read disturb and the frequency of occurrence of deterioration (failure) due to erase and write operations. Then, it is possible to reduce the number of erase and write operations to a minimum and alleviate the deterioration due to the operations. The repair condition is set within the range of the error correction capability of the error correction part 6.

The threshold value serves as a trigger of an operation of rewriting the temporarily stored data, and a comparison value corresponding to the threshold value is checked by the error correction part 6 and if the comparison value exceeds the threshold value, the temporarily stored data is rewritten. As a threshold value, for example, the number of readouts of stored data, the number of bit errors included in the stored data which is read out, the number of accumulated occurrences of bit errors in the stored data which is read out or the like can be set.

Further, in the memory area 7 of the flash memory 4, a use area 73 for storing application programs and the like therein and an unused area 74 for storing nothing therein are provided. Furthermore, the flash memory 4 is provided with a control table (not shown) for managing storage information on data stored in the flash memory 4.

<Prevention of Bit Error>

Next, specific discussion will be made on prevention of bit errors in the information processing apparatus 1 having the above constitution. The prevention of bit errors includes not only prevention of occurrence of bit errors but also prevention of occurrence of serious troubles such as runaway of a system or the like by correcting the bit error which occurs and recovering the stored data which has the error.

Figure 2:
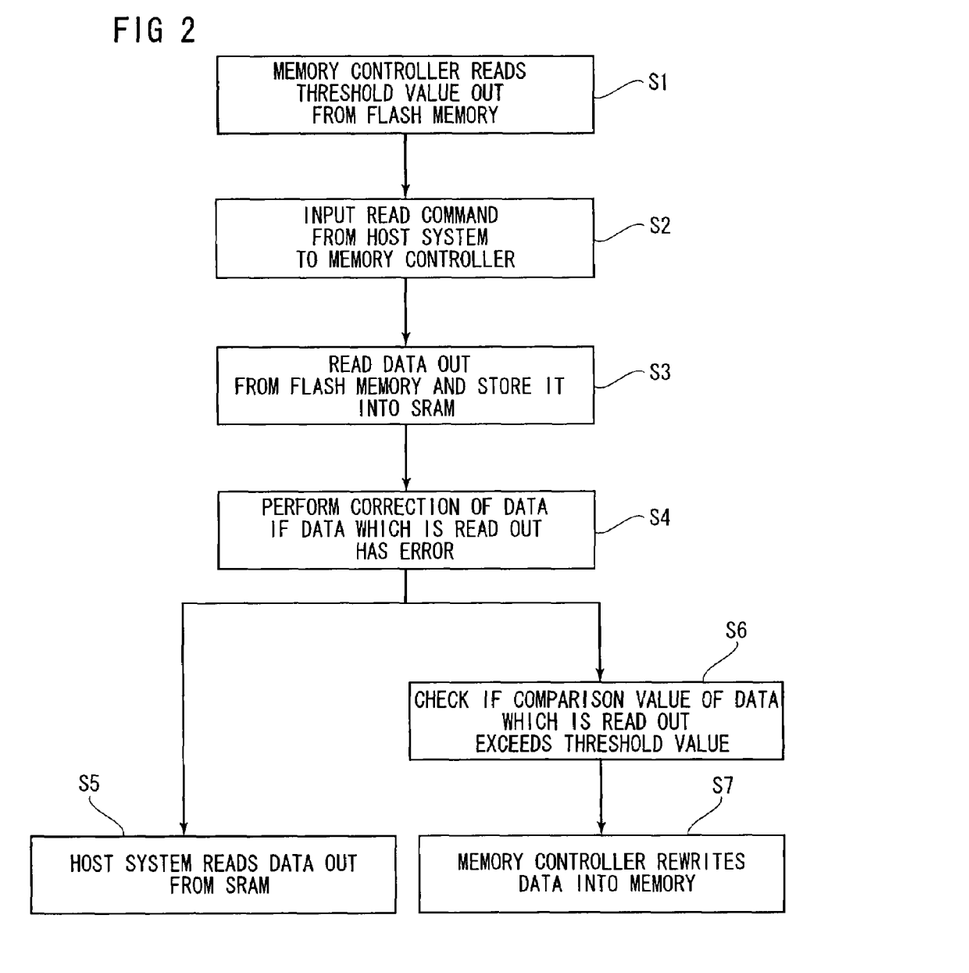
FIG. 2 is a flowchart showing a procedure of preventing a bit error.

FIG. 2 is a flowchart showing a procedure of preventing a bit error. The procedure steps for preventing a bit error are included in a process of reading the stored data out from the flash memory 4 by the host system 2. Hereinafter, discussion will be made along the procedure of FIG. 2.

First, prior to the operation of reading the stored data such as application program or the like which is stored in the memory area 7, the threshold value is read out from the redundant area 8 of the flash memory 4 by the error correction part 6 (Step S1). At power-on, for example, the threshold value is read out.

The threshold value is set for a predetermined amount of stored data to be read out and can be set by the unit of page 71 or block 72, for example. The threshold value is generally set by the page. Then, the number of readouts of the stored data, the number of bit errors included in the stored data, the number of accumulated occurrences of bit errors or the like can be set as the threshold value.

The number of readouts is preferable as the threshold value for the read disturb error. As discussed earlier, the read disturb error is caused by repeated read operations. Therefore, it is assumed that the risk of occurrence increases as the number of sequential readouts becomes larger. In the case of this threshold value, if the comparison value exceeds the threshold value even before occurrence of a bit error, the operation of rewriting the temporarily stored data which is read out without any change is performed to recover (initialize) the bit data. Therefore, it is advantageously possible to prevent occurrence of a bit error.

The number of bit errors can be set as the threshold value in a link with the already-existing error correction function such as ECC. For example, when an error of 4 bits or less can be corrected with ECC, the threshold value of 3 bits is set. Then, before the error exceeds the error correction capability with ECC, a correctable bit error is corrected to effectively utilize the function of ECC and it is therefore possible to improve the reliability of the flash memory.

The number of accumulated occurrences of bit errors is a threshold value which is set with attention paid to the characteristics of the memory area 7 of the memory. This is because it is assumed that there arises difference in likelihood of occurrence of bit errors depending on the memory areas 7.

The threshold value is not limited to these examples and combination of a plurality of these threshold values may be set. After the data is rewritten, the threshold value is reset since the bit data is initialized.

Subsequently, a read command as a request for reading of the stored data is inputted to the memory controller 3 from the host system 2, for example, when a game or the like is executed (Step S2). Then, the memory controller 3 reads the requested stored data out from the flash memory 4 and stores it into the temporary memory part 5 temporarily as temporarily stored data (Step S3).

At this time, the error correction part 6 checks if the temporarily stored data has an error and corrects the data if it has an error (Step S4), and the host system 2 reads the correct stored data with no error out from the temporary memory part 5 (Step S5).

Further, the error correction part 6 checks if the comparison value of the temporarily stored data which is stored in the temporary memory part 5 exceeds the threshold value (Step S6). Specifically, the comparison value corresponding to the threshold value of the temporarily stored data is compared with the threshold value. Then, if the comparison value of the temporarily stored data exceeds the threshold value, the memory controller 3 writes the temporarily stored data into the flash memory 4 (Step S7).

While the memory controller 3 rewrites the temporarily stored data into the flash memory 4, an ordinary read operation for the stored data can not be executed or the execution of the read operation is remarkably limited. For this reason, it is preferable to provide an element for sending a status signal notifying the busy state to the host system 2 interlockingly with the rewrite operation in the memory controller 3. This is because an efficient operation can be performed in the host system 2 in response to the status signal. Further, there may be another case where an error information or the like is once read out in the host system 2 and the rewrite operation to the flash memory 4 is performed on the basis of the instruction of the rewrite command from the host system 2. This is because this makes it possible to efficiently perform the rewrite operation interlockingly with the operation in the host system 2.

Figure 3A:
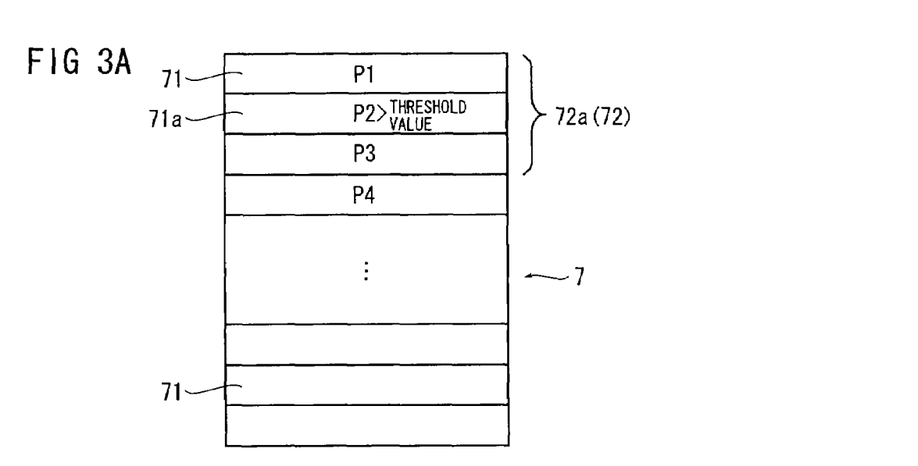
FIGS. 3A to 3C are views showing a structure of a memory area of a flash memory.
Figure 3B:
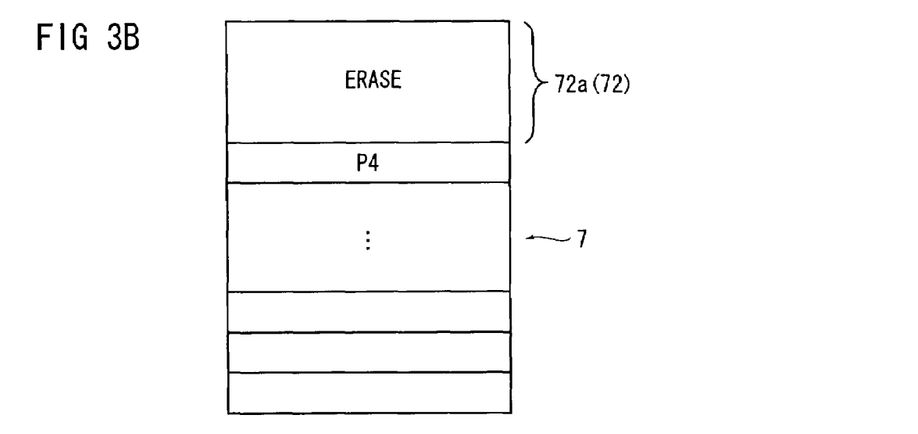
Figure 3C:
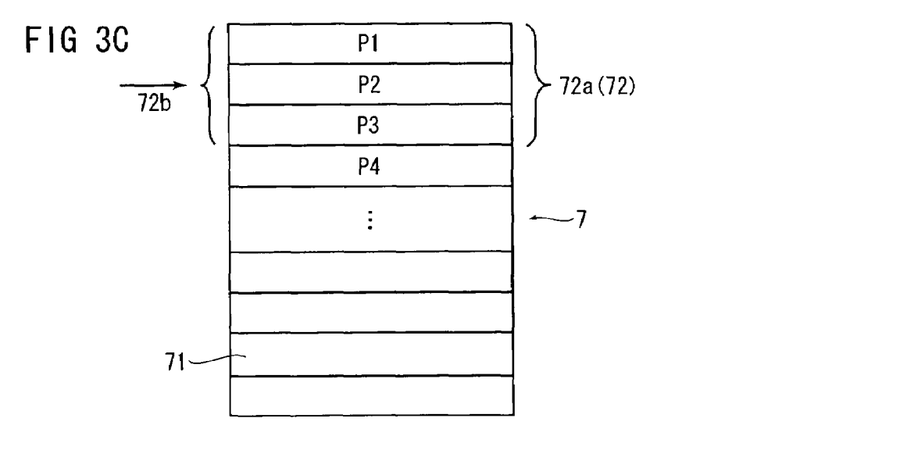

Next, specific discussion will be made on the rewrite operation. FIGS. 3A to 3C are views showing a structure of the memory area 7 of the flash memory 4. As discussed earlier, the memory area 7 of the flash memory 4 has the pages 71 each serving as a unit of writing or reading and the blocks 72 each consists of a plurality of pages 71 and serves as a unit of erasing the stored data. In other words, the flash memory 4 can only collectively erase the stored data by the block and data can be written into only the unused areas with data erased. It is impossible to rewrite only the page in which an error occurs without erasing other pages in the same block.

Herein, for convenience of discussion, as shown in FIG. 3A, it is assumed that one block 72a consists of a plurality of pages 71 of P1 to P3 and the comparison value of the page 71a of P2 exceeds the threshold value.

As one of the rewrite operations, as shown in FIG. 3B, the stored data in the block 72a including the page 71a of P2 the comparison value of which exceeds the threshold value is temporarily stored in one of other memory devices in the information processing apparatus 1 including the temporary memory part 5 and the stored data in the block 72a is collectively erased. Then, as shown in FIG. 3C, a block data 72b including new pages 71 of P1 to P3 which are the same as the erased pages 71 of P1 to P3 are written into the block 72a. As a matter of course, if there occurs a bit error in the original pages 71 of P1 to P3, the bit error is corrected and the new pages 71 are written. Even if no bit error occurs, it is possible to prevent occurrence of a bit error since the bit data is initialized by rewriting. Especially, since the pages 71 which are positioned around the original page 71a of P2 and potentially has a possibility of occurrence of bit errors are also rewritten, this is an effective method of preventing the bit errors.

Figure 4:
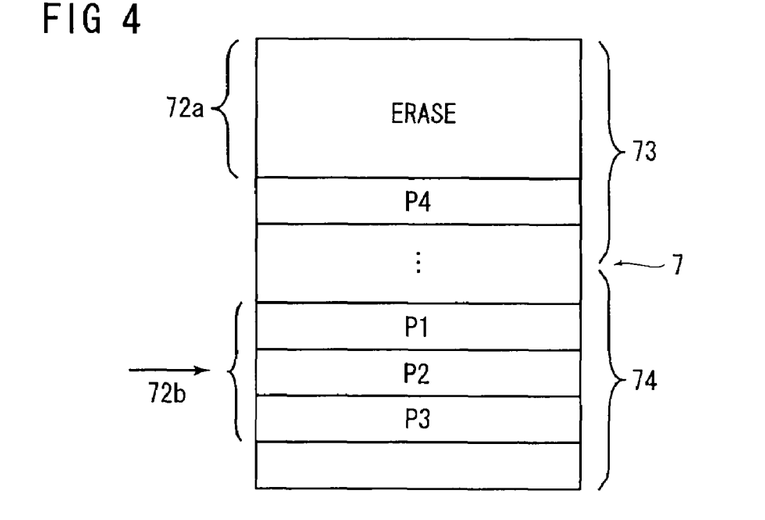
FIG. 4 is a view showing a structure of the memory area of the flash memory.
Figure 5:
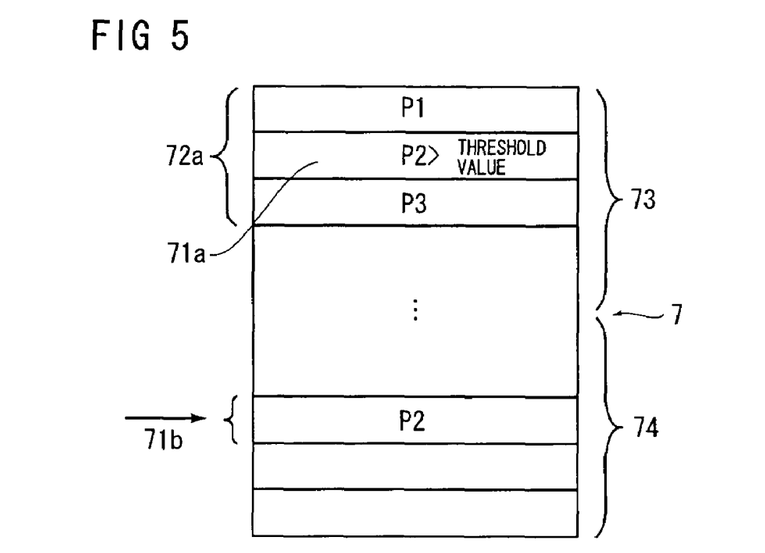
FIG. 5 is a view showing a structure of the memory area of the flash memory.

FIGS. 4 and 5 are views showing a rewrite operation using the unused area 74 in the flash memory 4. In this case, in the information processing apparatus 1 provided is a management part for managing storage information of the stored data which is stored in the flash memory 4, such as FAT or the like.

FIG. 4 is a view showing an operation by the block. The block data 72b including the new pages of P1 to P3 is stored in the unused area 74 and the management part modifies the storage information to change the execution of reading the pages 71 to the execution of reading the new pages 71. This is advantageous in that the operation efficiency increases since it is not necessary to temporarily store the pages 71 by the block. Since the block 72a can be reused by erasing even in the use area 73, another data may be stored therein or the new pages of P1 to P3 which are stored in the unused area 74 may be rewritten into the original block 72a again.

FIG. 5 is a view showing an operation by the page. In this case, the operation may not be performed by the block. Specifically, the temporarily stored data in the page 71a of P2 which is stored in the temporary memory part 5 is written into the unused area 74 as a new page 71b of P2. As a matter of course, the data is written with a bit error corrected if it has. Then, the management part modifies the storage information to change the execution of reading the original page 71a of P2 to execution of reading the new page 71b of P2. Since the amount of data to be rewritten is small and the execution takes only a short time, this operation is suitable for e.g., an operation during execution of an application program.

An operation of rewriting data into another flash memory can be performed. Specifically, in the same manner as the above-discussed rewrite operation using the unused area 74, the data is rewritten into an unused area in another flash memory included in the information processing apparatus 1, instead of the unused area 74 in the same flash memory 4.

Such a series of operations for preventing a bit error may be collectively performed at a predetermined timing, such as power-on or power-off of the information processing apparatus 1. Specifically, at power-on or power-off, read access is made to the entire memory area 7 of the flash memory 4 for the purpose of preventing the bit error. At power-on or power-off, there is no possibility that an ordinary read operation for the application program is interrupted to cause a busy state, and this prevents a user who operates the information processing apparatus 1 from becoming uncomfortable.

In addition, the rewrite operations may be performed at a timing where the load of access is less, such as at the backup of data to an application program or at idle. Further, the rewrite operations may be performed while the information processing apparatus 1 is in a sleep state or on charge. The rewrite operations may be performed periodically by setting a predetermined program or the like in advance, or on the basis of an instruction of execution which is externally inputted.

The read access for the rewrite operations may be made to part of the memory area, instead of the entire memory area. For example, information on the area to which read access is made is stored and the read access is made on the basis of the area information. The area information may be set on e.g., the memory area 7 and the redundant area 8 of the flash memory 4 and other nonvolatile semiconductor memories included in the memory controller 3 within the memory card, and the host system 2 and other flash memories included in the information processing apparatus 1 outside the memory card.

There may be another case where the entire memory area 7 is divided into a plurality of areas and the read access for the rewrite operations may be made at the above predetermined timing a plurality of times, to make read access to the entire memory area 7.

Further, by dividing the memory area 7 into a plurality of element memory areas on the basis of the characteristics on the bit error, it is possible to set the threshold value for each element memory area. For example, depending on the physical characteristics of the flash memory 4 and the characteristics of the application program stored therein, the memory area 7 to which a complicated read operation is performed can be specified in advance. Then, in accordance with the characteristics, the memory area 7 is logically or physically divided into a plurality of areas (element memory areas), and the threshold value suitable for each element memory area, e.g., the number of readouts, is individually set. This reduces unnecessary write operations or the like, and the load for procedure can be thereby reduced and it becomes possible to more precisely prevent the bit error.

Thus, since the stored data with strong possibility of occurrence of a bit error is rewritten and the bit data which changes with time is recovered (initialized) in the present invention, it is possible to prevent occurrence of bit errors. Then, by rewriting data within the error correction capability combined with the conventional error correction function such as ECC, the error correction function can be complemented and it is thereby possible to further improve the reliability of the flash memory 4.

Though the error correction part 6 is provided in the memory controller 3 in the above preferred embodiment, the error correction part 6 may be provided in the host system 2.

Further, though the threshold value is set in the redundant area 8 of the flash memory 4 in the above preferred embodiment, the threshold value may be set in one of other elements. For example, the memory area 7 of the flash memory 4 and other nonvolatile semiconductor memories included in the memory controller 3 may be used within the memory card, and other nonvolatile semiconductor memories used for calibration data or the like included in the information processing apparatus 1 may be used outside the memory card. Exceeding the threshold value usually refers to that the comparison value exceeds the threshold value but sometimes refers to that the comparison value falls short of the threshold value depending on the content of the threshold value.

The repair condition may be given as an external instruction. For example, the information processing apparatus 1 comprises an element for making access to a network, and the operation of rewriting data into the flash memory 4 may be performed on the basis of the information received from a server via a network.

While the invention has been shown and described in detail, the foregoing description is in all aspects illustrative and not restrictive. It is therefore understood that numerous modifications and variations can be devised without departing from the scope of the invention.

What is claimed is:

1. A bit error prevention method of preventing a bit error due to a change of bit data stored in a rewritable nonvolatile semiconductor memory having a plurality of data storage areas, comprising:
   determining whether a repair condition related to a number of read operations performed on one of the plurality of data storage areas of the rewritable nonvolatile semiconductor memory is satisfied when data stored in the one of the plurality of data storage areas of said nonvolatile semiconductor memory is read by a host system, each of the plurality of data storage areas having a different threshold number of read operations as a repair condition; and
   rewriting said data read by the host system in the one of the plurality of data storage areas of said nonvolatile semiconductor memory when said data read by the host system satisfies said repair condition of the one of the plurality of data storage areas of the rewritable nonvolatile semiconductor memory.

2. The bit error prevention method according to claim 1, wherein a parameter of the data stored in the one of the plurality of data storage areas and related to the number of read operations is compared to a predetermined threshold value, the threshold value being related to the repair condition,
   the determining includes determining whether the parameter of said data stored in the one of the plurality of data storage areas and related to the number of read operations exceeds said predetermined threshold value, and
   said rewriting includes
   rewriting said data read by the host system into said one of the plurality of data storage areas of the nonvolatile semiconductor memory when said parameter related to the number of read operations exceeds the predetermined threshold value.

3. The bit error prevention method according to claim 2, further comprising:
   storing said data read by the host system into a temporary memory part as temporarily stored data,
   wherein whether said parameter exceeds said predetermined threshold value is determined when said temporarily stored data is stored into said temporary memory part, and when said parameter exceeds said predetermined threshold value, said temporarily stored data is rewritten into said one of the plurality of data storage areas of the nonvolatile semiconductor memory.

4. The bit error prevention method according to claim 3, further comprising:
   judging whether said temporarily stored data has an error when said temporarily stored data is stored into said temporary memory part and correcting the error in said temporarily stored data when said temporarily stored data has an error,
   wherein said temporarily stored data is rewritten into said one of the plurality of data storage areas of the nonvolatile semiconductor memory after correction of the error.

5. The bit error prevention method according to claim 2, wherein said threshold value includes at least one of the number of read operations of said stored data, or a number of accumulated occurrences of bit errors in said stored data during read operations of the one of the plurality of data storage areas.

6. The bit error prevention method according to claim 1, further comprising:
   making read access to the one of the plurality of data storage areas of said nonvolatile semiconductor memory which stores said stored data at a predetermined timing.

7. The bit error prevention method according to claim 6, wherein said predetermined timing includes power-on or power-off.

8. The bit error prevention method according to claim 6, wherein read access is made to one or more of the plurality of data storage areas of said nonvolatile semiconductor memory during the read access.

9. The bit error prevention method according to claim 1, wherein said bit error includes a read disturb error.

10. The method according to claim 1, wherein rewriting said data includes rewriting the data in a same location of the one of the plurality of data storage areas on which the read operation was performed by the host system.

11. The method according to claim 10, wherein rewriting said data further includes rewriting data stored in data storage areas adjacent to the one of the plurality of data storage areas.

12. An information processing apparatus, comprising:
   a rewritable nonvolatile semiconductor memory including a plurality of data storage areas, each data storage area storing data and a repair condition related to a number of read operations performed on the data storage area, the repair condition including a threshold number of read operations, each data storage area having a different threshold number of read operations;
   a read part to read the data stored in one of the plurality of data storage areas in said nonvolatile semiconductor memory;
   a condition judgment part to determine whether said data to be read by said read part satisfies a repair condition corresponding to the one of the plurality of data storage areas; and
   a recovery part to rewrite said data read by the read part into said one of the plurality of data storage areas in said nonvolatile semiconductor memory when said data read by the read part satisfies said repair condition of the one of the plurality of data storage areas.

13. The information processing apparatus according to claim 12, wherein a parameter of the data stored in the one of the plurality of data storage areas and related to the number of read operations is compared to a predetermined threshold value corresponding to the one of the plurality of data storage areas,
   said condition judgment part includes a judgment part to determine whether the parameter of said data to be read from the one of the plurality of data storage areas exceeds said predetermined threshold value, the predetermined threshold defining the repair condition for the one of the plurality of storage areas, and
   said recovery part includes a rewrite part to rewrite said data read by the read part into said one of the plurality of data storage areas of the nonvolatile semiconductor memory when said parameter exceeds the predetermined threshold value.

14. The information processing apparatus according to claim 13, further comprising:
   a temporary memory part to temporarily store said data read by the read part as temporarily stored data,
   wherein whether said parameter exceeds said predetermined threshold value when said temporarily stored data is stored into said temporary memory part, and when said parameter exceeds said threshold value, said temporarily stored data is rewritten into said one of the plurality of data storage areas of the nonvolatile semiconductor memory.

15. The information processing apparatus according to claim 14, further comprising:
   an error correction part to determine whether said temporarily stored data has an error when said temporarily stored data is stored into said temporary memory part, the error correction part correcting the error in said temporarily stored data when said temporarily stored data has an error,
   wherein said temporarily stored data is rewritten into said one of the plurality of data storage areas of the nonvolatile semiconductor memory after error correction.

16. The information processing apparatus according to claim 13, wherein each of the plurality of data storage areas of said nonvolatile semiconductor memory has a memory area to store said stored data therein and a redundant area to store error correction data therein, and said predetermined threshold value is set in said redundant area of the one of the plurality of data storage areas.

17. The information processing apparatus according to claim 13, wherein said predetermined threshold value includes at least one of a number of read operations performed on said one of the plurality of data storage areas or a number of accumulated occurrences of bit errors during read operations of data stored in the one of the plurality of data storage areas.

18. The information processing apparatus according to claim 12, further comprising:
   a part to make read access to one of the plurality of data storage areas of said nonvolatile semiconductor memory which stores said stored data at a predetermined timing.

19. The information processing apparatus according to claim 18, wherein said predetermined timing includes power-on or power-off.

20. The information processing apparatus according to claim 18, wherein said part to make read access makes read access to a plurality of the data storage areas in said nonvolatile semiconductor memory.

21. The information processing apparatus according to claim 17, wherein said bit error includes a read disturb error.

* * * * *